US009564859B2

(12) United States Patent
Ivanov et al.

(10) Patent No.: US 9,564,859 B2
(45) Date of Patent: Feb. 7, 2017

(54) CHOPPED OPERATIONAL-AMPLIFIER (OP-AMP) SYSTEM

(71) Applicant: TEXAS INSTRUMENTS INCORPORATED, Dallas, TX (US)

(72) Inventors: Vadim V. Ivanov, Tucson, AZ (US); Vaibhav Kumar, Tucson, AZ (US); Munaf H. Shaik, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/621,110

(22) Filed: Feb. 12, 2015

(65) Prior Publication Data

US 2015/0229278 A1    Aug. 13, 2015

Related U.S. Application Data

(60) Provisional application No. 61/938,760, filed on Feb. 12, 2014.

(51) Int. Cl.
*H03F 1/26* (2006.01)
*H03F 3/387* (2006.01)
(Continued)

(52) U.S. Cl.
CPC .............. *H03F 1/26* (2013.01); *H03F 3/387* (2013.01); *H03F 3/45475* (2013.01);
(Continued)

(58) Field of Classification Search
CPC ............ H03F 3/45475; H03F 2200/261; H03F 2203/45116; H03F 3/393; H03F 1/26; H03F 2200/405; H03F 2203/45512; H03F 2203/45544; H03F 3/45179; H03F 1/0205; H03F 2200/411; H03F 2203/45138; H03F 2203/45; H03F 3/005; H03F 1/303; H03F 2203/7233; H03F 2203/7212; H03F 2200/231; H03F 2200/249; H03F 2200/375; H03F 2200/396; H03F 2200/414; H03F 3/2178; H03F 3/45968
(Continued)

(56) References Cited

U.S. PATENT DOCUMENTS 7,586,368 B2 * 9/2009 Trifonov ................. H03F 3/393
330/9
7,764,118 B2 * 7/2010 Kusuda ............... H03F 3/45977
330/9

(Continued)

*Primary Examiner* — Khanh V Nguyen
(74) *Attorney, Agent, or Firm* — Gregory J. Albin; Charles A. Brill; Frank D. Cimino

(57) ABSTRACT

One example includes an OP-AMP circuit system. The system includes a signal amplification path comprising a signal amplification path comprising a signal amplifier and an output stage. The signal amplification path can be configured to amplify an input voltage received at an input to provide an output voltage via the output stage. The system also includes an offset-reduction path coupled to the input of the signal amplification path and to an output of the signal amplifier. The offset-reduction path includes a transconductance amplifier and at least one chopper that are configured to mitigate noise in the signal amplification path and a noise-filtering feedback path configured to provide chopper feedback with respect to an offset voltage associated with the offset-reduction path, the noise-filtering feedback path comprising a feedback path input coupled to the input of the transconductance amplifier via a resistor.

20 Claims, 2 Drawing Sheets

(51) Int. Cl.
*H03F 3/45* (2006.01)
*H03F 3/00* (2006.01)

(52) U.S. Cl.
CPC ......... *H03F 3/45968* (2013.01); *H03F 3/005* (2013.01); *H03F 2200/249* (2013.01); *H03F 2200/372* (2013.01); *H03F 2200/375* (2013.01); *H03F 2203/45118* (2013.01); *H03F 2203/45138* (2013.01); *H03F 2203/45512* (2013.01)

(58) Field of Classification Search
USPC .......................................................... 330/9
See application file for complete search history.

(56) References Cited

U.S. PATENT DOCUMENTS

| | | | | |
|---|---|---|---|---|
| 7,821,333 B2 * | 10/2010 | Yan | ........................ | H03F 1/0216 |
| | | | | 330/9 |
| 8,120,422 B1 * | 2/2012 | Huijsing | .................. | H03F 1/083 |
| | | | | 330/9 |
| 8,786,363 B2 * | 7/2014 | Ahmad | ................... | H03F 3/387 |
| | | | | 330/9 |
| 2014/0232456 A1 * | 8/2014 | Huijsing | ................... | H03F 1/56 |
| | | | | 330/9 |

* cited by examiner

CHOPPED OPERATIONAL-AMPLIFIER (OP-AMP) SYSTEM

CROSS-REFERENCE TO RELATED APPLICATION

This application claims the benefit of U.S. Provisional Patent Application No. 61/938,760, filed Feb. 12, 2014, and entitled "PRECISION CHOPPED OPERATIONAL AMPLIFIER", which is incorporated herein by reference in its entirety.

TECHNICAL FIELD

This disclosure relates generally to electronic systems, and more specifically to a chopped operational-amplifier (OP-AMP) system.

BACKGROUND

Frequency chopping is a technique that can be implemented in high-precision complementary-oxide semiconductor (CMOS) amplifier circuits to improve low-frequency accuracy and to achieve a low offset. As an example, a chopper can be configured as a switching device to convert fixed DC input voltages to an AC output. For example, a chopper can be configured as an electronic switch system that is used to interrupt one signal under the control of another. Choppers can be implemented in a variety of applications, such as signal-sensing applications in which errors at DC voltages and/or low-frequency can be highly detrimental. However, typical chopper implementations may not eliminate noise and offset conditions, but may instead merely shift the noise and offset conditions to a frequency associated with control of the choppers. Frequency control of the choppers can be implemented to mitigate such deleterious effects, but increasing frequency can often increase input currents. Such increases in input currents can result in a sacrifice of accuracy of the amplifier system based on an introduction of DC errors.

SUMMARY

One example includes an operational amplifier (OP-AMP) circuit system. The system includes a signal amplification path comprising a signal amplification path comprising a signal amplifier and an output stage. The signal amplification path can be configured to amplify an input voltage received at an input to provide an output voltage via the output stage. The system also includes an offset-reduction path coupled to the input of the signal amplification path and to an output of the signal amplifier. The offset-reduction path includes a transconductance amplifier and at least one chopper that are configured to mitigate noise in the signal amplification path and a noise-filtering feedback path configured to provide chopper feedback with respect to an offset voltage associated with the offset-reduction path, the noise-filtering feedback path comprising a feedback path input coupled to the input of the transconductance amplifier via a resistor.

Another example includes a method for amplifying an input voltage to generate an output voltage. The method includes receiving the input voltage at an input of a signal amplification path comprising a signal amplifier configured to amplify the input voltage to provide the output voltage at an output. The method also includes providing a clock signal to a first chopper in an offset-reduction path configured to chop the input voltage, the offset-reduction path comprising a transconductance amplifier mitigate an offset voltage in the input voltage at an output of the signal amplifier based on the chopped input voltage. The method further includes providing the clock signal to a second chopper in a noise-filtering feedback path having a feedback path input coupled to the input of the transconductance amplifier via a resistor. The resistor can have a resistance value that is selected to increase an impedance at an input of the transconductance amplifier and to increase a gain in the noise-filtering feedback path to decrease chopping-induced noise in the offset-reduction path.

Another example includes an OP-AMP circuit system. The system includes a signal amplification path comprising a signal amplifier configured to amplify an input voltage received at an input to provide an output voltage at an output. The system also includes an offset-reduction path coupled to the input of the signal amplification path and to an input of the signal amplifier. The offset-reduction path includes a first transconductance amplifier configured to receive the input voltage and a second transconductance amplifier having an output coupled to an output of the signal amplifier. The offset-reduction path also includes a chopper interconnecting the first and second transconductance amplifiers, and a noise-filtering feedback path configured to provide chopper feedback with respect to an offset voltage associated with the first transconductance amplifier. The noise-filtering feedback path includes a feedback path input coupled to the input of the second transconductance amplifier via a resistor having a resistance value that is chosen to be less than a resistance associated with an output of the first transconductance amplifier.

DETAILED DESCRIPTION

This disclosure relates generally to electronic systems, and more specifically to a chopped operational-amplifier (OP-AMP) system. An OP-AMP system can include a signal amplification path and an offset-reduction path that can implements a chopping modulation/demodulation scheme. The signal amplification path can include at least one transconductance amplifier coupled to an output stage that can include a capacitor coupled between an input and output of the output stage. In addition, the OP-AMP system can also include an offset-reduction path that can include at least one chopper to provide a chopped, amplified, and demodulated version of the input voltage to an input of the output stage of the signal amplification path via a second transconductance amplifier. As an example, the offset-reduction path can include a first chopper that can modulate the input voltage based on a chopping frequency, with the modulated input voltage being amplified by a third transconductance amplifier. A second chopper can demodulate the amplified signal and provide the demodulated signal to the second transconductance amplifier. The amplified demodulated signal from the output of the second transconductance amplifier can thus be provided to an input of the output stage for offset-reduction in the signal amplification stage. Additional frequency compensation can be provided via a second capacitor coupled between the output stage and the input of the second transconductance amplifier.

To substantially mitigate noise associated with the offset of the third transconductance amplifier, the offset-reduction path can include a noise-filtering feedback path that is arranged between an output and an input of the second chopper. The noise-filtering feedback path can include, for example, a fourth transconductance amplifier, a third chopper, and a fifth transconductance amplifier. Therefore, noise at the chopping frequency at the input of the second transconductance amplifier (e.g., resulting from the offset voltage) can be amplified, demodulated, and provided to the output of the third transconductance amplifier in a feedback manner to decrease a low-frequency voltage caused by the offset and noise of the third transconductance amplifier. Additionally, a resistor (or set of resistors in the example of a differential input voltage) can interconnect a feedback path input of the noise-filtering feedback and an input of the second transconductance amplifier to increase an impedance at an input of the second transconductance amplifier. As a result, the noise-filtering feedback path can achieve an increased gain and can mitigate chopping noise resulting from modulated offset ad low-frequency noise of the third transconductance amplifier. Accordingly, the resistive connection of the noise-filtering feedback path to the second transconductance amplifier in the offset-reduction path can provide for a more accurate operation of the OP-AMP system at or near the chopping frequency.

Figure 1:
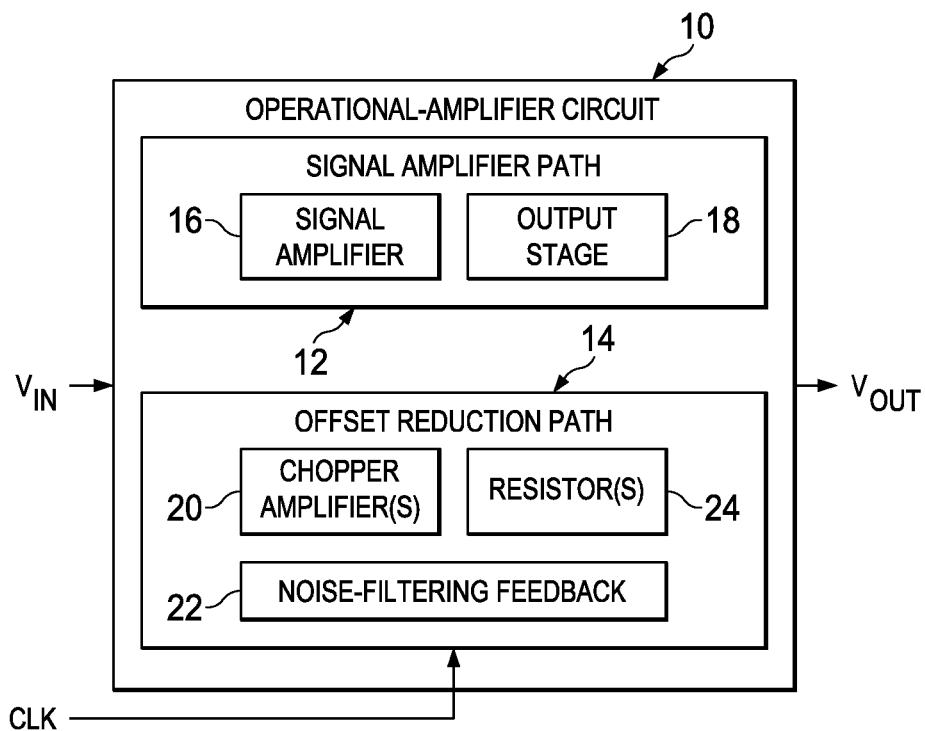
FIG. 1 illustrates an example of an operational-amplifier (OP-AMP) system.

FIG. 1 illustrates an example of an operational-amplifier (OP-AMP) system 10. The OP-AMP system 10 can be implemented in a variety of applications to amplify an input voltage, demonstrated in the example of FIG. 1 as an input voltage $V_{IN}$, to provide an output signal, demonstrated in the example of FIG. 1 as an output voltage $V_{OUT}$. As described herein, the OP-AMP system 10 implements frequency chopping, such as in signal-sensing applications in which errors at DC voltages and/or low-frequency can be detrimental. As described herein, the terms "chop" and "chopping" refers to modulating and/or demodulating a signal at a chopping frequency, such as to reduce noise associated with the signal or another signal with which the signal is combined. The OP-AMP system 10 includes a signal amplification path 12 and an offset-reduction path 14. As an example, the input voltage $V_{IN}$ can be provided to the signal amplification path 12, such as at a high frequency, and the offset-reduction path 14 can implement frequency chopping on the input voltage $V_{IN}$ to improve accuracy of the amplification of the input voltage $V_{IN}$, such as based on low-frequency chopping, as described herein.

The signal amplification path 12 can include signal amplifier 16 (e.g., a transconductance amplifier) and an output stage 18 that are configured to amplify the input voltage $V_{IN}$ that is provided at an input of the signal amplification path 12. The signal amplification path 12 can thus provide the output voltage $V_{OUT}$ at an output of the output stage 18 as an amplified version of the input voltage $V_{IN}$. The offset-reduction path 14 includes at least one chopper 20 to provide chopping of the input voltage $V_{IN}$, such as to provide the chopped input voltage $V_{IN}$ to an input of the signal amplifier 16 of the signal amplification path 12. In the example of FIG. 1, the offset-reduction path 14 receives a clock signal CLK that has a frequency corresponding to a chopping frequency, such that the chopper(s) 20 provide frequency chopping at the chopping frequency of the clock signal CLK. As an example, the chopper(s) 20 can include a first chopper that can modulate the input voltage $V_{IN}$ at the chopping frequency of the clock signal CLK, with the modulated input voltage being amplified by the offset-reduction path 14 (e.g., via a first transconductance amplifier). A second of the chopper(s) 20 can demodulate the amplified and modulated input voltage $V_{IN}$ and amplify the demodulated signal (e.g., via a second transconductance amplifier). The amplified demodulated signal can thus be provided to an input of the signal amplifier 16 (e.g., the OP-AMP) in the signal amplification path 12 to provide noise-reduction of the input voltage $V_{IN}$ in generating the output voltage $V_{OUT}$.

As described previously, the offset-reduction path 14 implements frequency chopping to substantially mitigate detrimental errors at DC and/or low-frequency of the input voltage $V_{IN}$. Additionally, offset voltages (e.g., in the range of as low as micro-volts) can be exhibited downstream of one or more of the chopper(s) 20, thus resulting in errors in the output voltage $V_{OUT}$. To substantially mitigate an offset voltage associated with the offset-reduction path 14 (e.g., at an output of a first of the chopper(s) 20), the offset-reduction path 14 includes a noise-filtering feedback path 22, such as arranged between an output and an input of a second one of the chopper(s) 20. The noise-filtering feedback path 22 can include, for example, an arrangement of transconductance amplifiers and a chopper that are collectively configured to detect and mitigate the offset voltage in the offset-reduction path 14. Therefore, noise at the chopping frequency of the clock signal CLK in the noise-amplifier path 14 (e.g., resulting from the offset voltage) can be amplified, demodulated, and provided to an input of one of the chopper(s) 20 in a feedback manner to mitigate the offset voltage. In the example of FIG. 1, at least one resistor 24 can interconnect a feedback path input of the noise-filtering feedback path 22 and the offset-reduction path 14 (e.g., an input of a transconductance amplifier) to increase an input impedance of the respective amplifier of the offset-reduction path 14. As a result, the noise-filtering feedback path 22 can achieve an increased gain and can mitigate noise resulting from modulated and gained offset of chopper amplifiers at frequencies approaching the chopping frequency of the clock signal CLK. Accordingly, the coupling of the noise-filtering feedback path 22 to the offset-reduction path 14 via the resistor(s) 24 can provide for a more accurate operation of the OP-AMP system 10 at or near the chopping frequency of the clock signal CLK.

Figure 2:
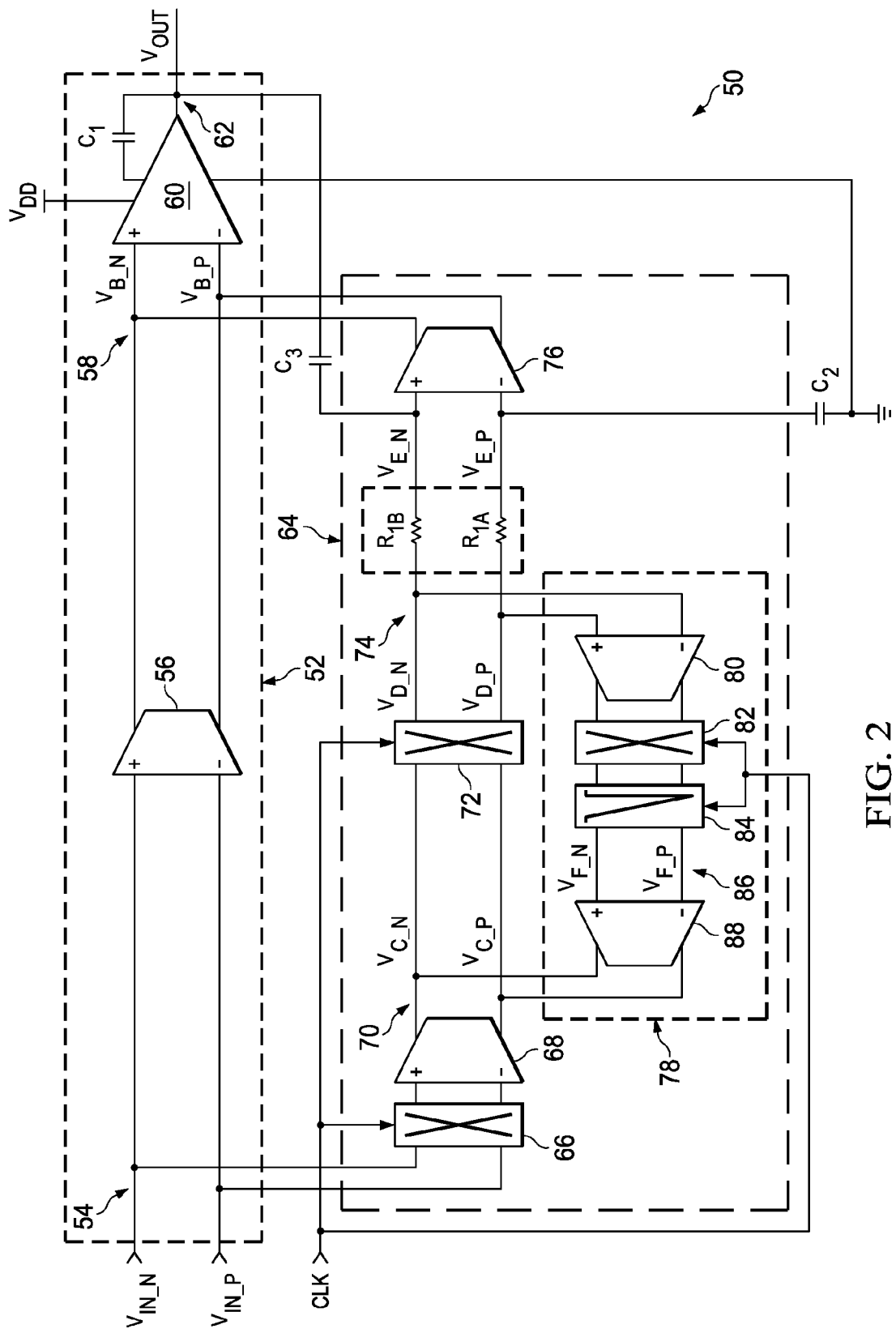
FIG. 2 illustrates an example of an OP-AMP circuit.

FIG. 2 illustrates an example of an OP-AMP circuit 50. The OP-AMP circuit 50 can be implemented in a variety of applications to amplify an input voltage, demonstrated in the example of FIG. 2 as a differential input voltage $V_{IN\_P}$ and $V_{IN\_N}$, to provide an output signal, demonstrated in the example of FIG. 2 as an output voltage $V_{OUT}$. As an example, the OP-AMP circuit 50 can correspond to the OP-AMP system 10 in the example of FIG. 1, and thus implements frequency chopping, such as in signal-sensing applications in which errors at DC voltages and/or low-frequency can be detrimental. As an example, the OP-AMP circuit 50 can be implemented in or in part of an integrated circuit (IC) chip.

The OP-AMP circuit 50 includes a signal amplification path 52 that receives differential input voltage $V_{IN\_P}$ and $V_{IN\_N}$ at an input 54. In the example of FIG. 2, the differential input voltage $V_{IN\_P}$ and $V_{IN\_N}$ is provided to a signal amplifier 56, demonstrated in the example of FIG. 2 as a transconductance amplifier having a transconductance $g_{m0}$, and which provides an output on a set of nodes 58 having a differential voltage $V_{B\_P}$ and $V_{B\_N}$ to an output stage 60 (demonstrated in the example of FIG. 2 as an amplifier), such that the voltage $V_{B\_N}$ is provided to a non-inverting input of the output stage 60 and the voltage $V_{B\_P}$ is provided to an inverting input of the output stage 60. The output stage 60 is thus configured to generate the output voltage $V_{OUT}$ at an output 62 based on the differential voltage $V_{B\_P}$ and $V_{B\_N}$. In the example of FIG. 2, the output stage 60 is powered by a voltage $V_{DD}$, and includes a frequency-compensation capacitor $C_1$ that is coupled to the output 62. Thus, the signal amplification path 52 can amplify the differential input voltage $V_{IN\_P}$ and $V_{IN\_N}$ to provide the output voltage $V_{OUT}$, such as at a high frequency.

The OP-AMP circuit 50 also includes an offset-reduction path 64 that is coupled to the input 54 and to the nodes 58. The differential input voltage $V_{IN\_P}$ and $V_{IN\_N}$ is provided to a chopper 66 that is configured to implement chopping modulation of the differential input voltage $V_{IN\_P}$ and $V_{IN\_N}$ based on the clock signal CLK operating at a chopping frequency. The chopped differential input voltage $V_{IN\_P}$ and $V_{IN\_N}$ is provided to a transconductance amplifier 68 that provides an output on a set of nodes 70 having a differential voltage $V_{C\_P}$ and $V_{C\_N}$. The differential voltage $V_{C\_P}$ and $V_{C\_N}$ is provided to a chopper 72 that is configured to implement chopping demodulation of the differential voltage $V_{C\_P}$ and $V_{C\_N}$ based on the clock signal CLK operating at the chopping frequency.

The chopper 72 provides a differential voltage $V_{D\_P}$ and $V_{D\_N}$ to a set of resistors $R_{1A}$ and $R_{1B}$ via a node 74. The set of resistors $R_{1A}$ and $R_{1B}$ thus correspond, respectively, to the differential voltage $V_{D\_P}$ and $V_{D\_N}$ to provide a differential voltage $V_{E\_P}$ and $V_{E\_N}$ at an input of a transconductance amplifier 76. The set of resistors $R_{1A}$ and $R_{1B}$ can have an approximately equal resistance value with respect to each other and which is much smaller than an output impedance of the transconductance amplifier 68. In the example of FIG. 2, the voltage $V_{E\_P}$ is coupled to a low-voltage rail (e.g., ground) via a capacitor $C_2$, and the voltage $V_{E\_N}$ is coupled to the output 62 of the output stage 60 via a capacitor $C_3$. As an example, the capacitors $C_2$ and $C_3$ can have an approximately equal capacitance value with respect to each other, and can provide a significant contribution to stability of the output voltage $V_{OUT}$, and thus an operational stability of the OP-AMP circuit 50. The transconductance amplifier 76 has a transconductance of $g_{m1}$, and is thus configured to amplify the differential voltage $V_{E\_P}$ and $V_{E\_N}$ to provide an output to the nodes 58 in a feedforward manner.

As described previously, the offset-reduction path 64 implements frequency chopping to substantially mitigate detrimental errors at DC and low-frequency noise associated with the signal amplifier 56 resulting from offset voltages of the transconductance amplifier 68 that are amplified and modulated to the chopping frequency by the chopper 72, such as resulting in resulting in errors in the output voltage $V_{OUT}$. To substantially mitigate noise associated with the offset-reduction path 64 (e.g., at an output of the chopper 66), the offset-reduction path 64 includes a noise-filtering feedback path 78 that is coupled at a feedback path input to the nodes 74 and at a feedback path output to the nodes 70. Therefore, the noise-filtering feedback path 78 provides feedback from an output to an input of the chopper 72.

The noise-filtering feedback path 78 includes a transconductance amplifier 80 having a transconductance of $g_{m2}$, and which has an input coupled to the nodes 74. Thus, the transconductance amplifier 80 amplifies the differential voltage $V_{D\_P}$ and $V_{D\_N}$. In this manner, the transconductance amplifier 80 detects the amplified and modulated offset voltage that can be exhibited at the input of the transconductance amplifier 68. The amplified differential voltage $V_{D\_P}$ and $V_{D\_N}$ is provided to a chopper 82 that is configured to implement chopping demodulation of the amplified differential voltage $V_{D\_P}$ and $V_{D\_N}$ based on the clock signal CLK operating at the chopping frequency. Thus, the amplified differential voltage $V_{D\_P}$ and $V_{D\_N}$ at the chopping frequency is demodulated. Additionally, the demodulated amplified differential voltage $V_{D\_P}$ and $V_{D\_N}$ is provided to a notch and/or low-frequency filter 84 that likewise operates based on the clock signal CLK, and thus at the chopping frequency. The notch filter 84 thus provides a differential voltage $V_{F\_P}$ and $V_{F\_N}$ at an output on nodes 86, such that the differential voltage $V_{F\_P}$ and $V_{F\_N}$ corresponds to the filtered and amplified differential voltage $V_{D\_P}$ and $V_{D\_N}$. The differential voltage $V_{F\_P}$ and $V_{F\_N}$ is provided at an input of a transconductance amplifier 88 having a transconductance of $g_{m3}$, and having an output that is coupled to the nodes 70 on which the differential voltage $V_{C\_P}$ and $V_{C\_N}$ is provided.

Therefore, the noise-filtering feedback path 78 can thus be configured to amplify, demodulate, and mitigate noise associated with the chopping frequency at the nodes 74, such that the noise can be removed from the nodes 70 in a feedback manner. Furthermore, as described previously, the resistors $R_{1A}$ and $R_{1B}$ interconnect the nodes 74 and the input of the transconductance amplifier 76, and thus are configured to increase an input impedance of the transconductance amplifier 76. As an example, the resistors $R_{1A}$ and $R_{1B}$ can have a resistance value that is selected to increase an impedance at an input of the transconductance amplifier 76 and to increase a gain in the noise-filtering feedback path 78 to decrease chopping-induced noise in the offset-reduction path 64. For example, the resistance value of the resistors $R_{1A}$ and $R_{1B}$ can have a resistance value that is less than (e.g., significantly less than, such as one or more orders of magnitude) a resistance associated with an output of the transconductance amplifier 68, and can be selected to have a resistance value that is greater than (e.g., significantly greater than, such as one or more orders of magnitude) an inverse of a product of the chopping frequency of the clock signal CLK and a capacitance value of the capacitors $C_2$ and $C_3$ (e.g., an equal capacitance value of the capacitors $C_2$ and $C_3$). As a result, the offset-reduction path 64 can achieve greater noise filtration at frequencies that are near the chopping frequency to provide a substantially more accurate operation of the OP-AMP circuit 50 in a simplistic manner, as opposed to typical chopped OP-AMP circuits.

As an example, leftover chopping noise $V_N$ associated with the nodes 74 can be expressed as follows:

$$V_N = V_C/(1+G_{45}) \qquad \text{Equation 1}$$

Where: $V_C$ corresponds to the DC voltage of the differential voltage $V_{C\_P}$ and $V_{C\_N}$; and
$G_{45}$ is an open-loop gain of the noise-filtering feedback path 78.

The open-loop gain $G_{45}$ of the noise-filtering feedback path 78 can be expressed as follows:

$$G_{45} = g_{m2}*Z_3*g_{m3}*Z_1 \qquad \text{Equation 2}$$

Where: $Z_3$ is a DC equivalent impedance at the input of the transconductance amplifier 88; and
$Z_1$ is an AC equivalent impedance at the input of the transconductance amplifier 76 (e.g., at approximately the chopping frequency of the clock signal CLK).

As provided in Equation 2, the open-loop gain $G_{45}$ of the noise-filtering feedback path 78 is therefore dependent on the input impedance of the transconductance amplifier 76. Absent the resistors $R_{1A}$ and $R_{1B}$, the AC equivalent impedance $Z_1$ is largely dominated by the capacitors $C_2$ and $C_3$, which, as described previously, can provide a significant contribution to stability of the output voltage $V_{OUT}$, and thus an operational stability of the OP-AMP circuit 50. However, the coupling of the capacitors $C_2$ and $C_3$ to the input of the transconductance amplifier 76 can result in a substantially low value of the AC equivalent impedance $Z_1$, which can reduce the open-loop gain $G_{45}$ of the noise-filtering feedback path 78, and can thus shift signal phase to provide an increased noise at frequencies near the chopping frequency of the clock signal CLK. Accordingly, the resistors $R_{1A}$ and $R_{1B}$ can provide a significant increase in the AC equivalent impedance $Z_1$ (e.g., $Z_1 \approx R_1$), and can therefore increase the open-loop gain $G_{45}$ of the noise-filtering feedback path 78 to decrease chopping-induced noise in the offset-reduction path 64 (e.g., at or near the chopping frequency of the clock signal CLK).

It is to be understood that the OP-AMP circuit 50 is not intended to be limited to the example of FIG. 2. As an example, the OP-AMP circuit 50 can be demonstrated simplistically, such that one or more additional circuit components (e.g., capacitors and/or resistors) can be included in the OP-AMP circuit 50. For example, a capacitor could be included to interconnect the nodes 86 to provide a stable input to the transconductance amplifier 88. Accordingly, the OP-AMP circuit 50 can be configured in a variety of ways.

Figure 3:
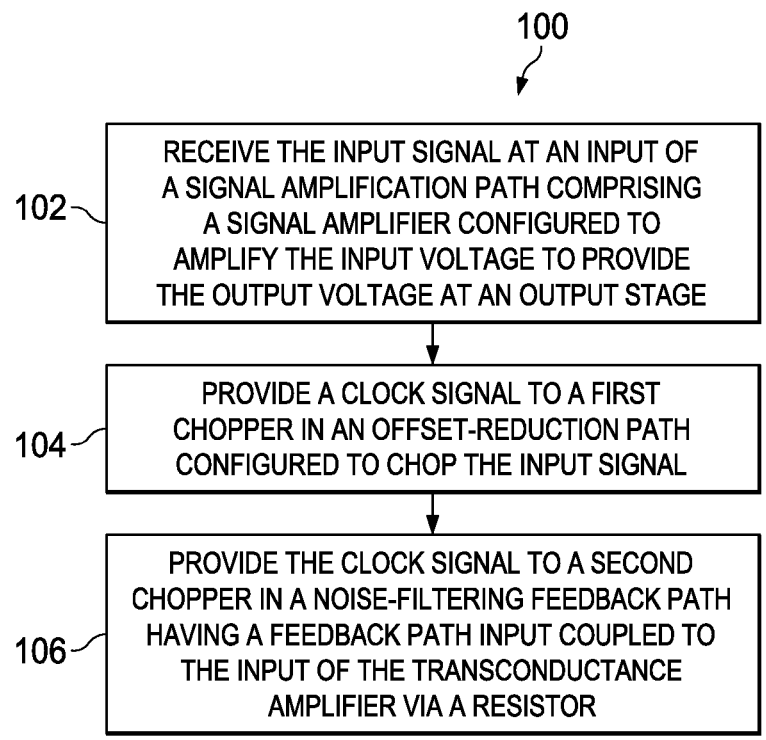
FIG. 3 illustrates an example of a method for amplifying an input voltage to generate an output voltage.

In view of the foregoing structural and functional features described above, a method in accordance with various aspects of the present invention will be better appreciated with reference to FIG. 3. While, for purposes of simplicity of explanation, the method of FIG. 3 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a method in accordance with an aspect of the present invention.

FIG. 3 illustrates an example of a method 100 for amplifying an input voltage (e.g., the input voltage $V_{IN}$) to generate an output voltage (e.g., the output voltage $V_{OUT}$) in an OP-AMP system (e.g., the OP-AMP system 10). At 102, the input voltage is received at an input (e.g., the input 54) of a signal amplification path (e.g., the signal amplification path 52) comprising a signal amplifier (e.g., the output stage 60) configured to amplify the input voltage to provide the output voltage at an output stage (e.g., the output stage 60). At 104, a clock signal (e.g., the clock signal CLK) is provided to a first chopper (e.g., the chopper 72) in an offset-reduction path (e.g., the noise filtering path 64) configured to chop the input voltage. The offset-reduction path can include a transconductance amplifier (e.g., the transconductance amplifier 76) configured to filter the input voltage at an output of the signal amplifier based on the chopped input voltage (e.g., the differential voltage $V_{E\_P}$ and $V_{E\_N}$). At 106, the clock signal is provided to a second chopper (e.g., the chopper 82) in a noise-filtering feedback path (e.g., the noise-filtering feedback path 78) having a feedback path input (e.g., the nodes 74) coupled to the input of the transconductance amplifier via a resistor (e.g., the resistors $R_{1A}$ and $R_{1B}$). The resistor can have a resistance value that is selected to increase an impedance at an input of the transconductance amplifier (e.g., the AC equivalent impedance $Z_1$) and to increase a gain in the noise-filtering feedback path (e.g., the open-loop gain $G_{45}$) to decrease chopping-induced noise in the offset-reduction path (e.g., resulting from an offset voltage at an input of the transconductance amplifier 68).

What have been described above are examples of the invention. It is, of course, not possible to describe every conceivable combination of components or method for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An operational-amplifier (OP-AMP) circuit comprising:
   a signal amplification path comprising a signal amplifier and an output stage, the signal amplification path being configured to amplify an input voltage received at an input to provide an output voltage via the output stage; and
   an offset-reduction path coupled to the input of the signal amplification path and to an output of the signal amplifier, the offset-reduction path comprising a transconductance amplifier and at least one chopper that are configured to mitigate noise in the signal amplification path and a noise-filtering feedback path configured to provide chopper feedback with respect to an offset voltage associated with the offset-reduction path, the noise-filtering feedback path comprising a feedback path input coupled to the input of the transconductance amplifier via a resistor.

2. The circuit of claim 1, wherein the resistor has a resistance value that is selected to increase an impedance at an input of the transconductance amplifier and to increase a gain in the noise-filtering feedback path to decrease chopping-induced noise in the offset-reduction path.

3. The circuit of claim 1, wherein the at least one chopper comprises a first chopper, wherein the noise-filtering feedback path comprises a second chopper configured to provide the chopper feedback, the noise-filtering feedback path having a feedback path output coupled to an input of the first chopper.

4. The circuit of claim 1, wherein the noise-filtering feedback path further comprises a notch filter operating at clock a frequency that is approximately equal to a chopping frequency associated with the at least one chopper.

5. The circuit of claim 1, wherein the at least one chopper comprises a first chopper, wherein the transconductance amplifier is a first transconductance amplifier, and wherein the noise-filtering feedback path further comprises:
   a second chopper;
   a second transconductance amplifier having an input corresponding to the feedback path input and an output that is provided to the second chopper; and
   a third transconductance amplifier that is interconnected between the second chopper and a feedback path output.

6. The circuit of claim 1, wherein the transconductance amplifier is a first transconductance amplifier, and wherein the at least one chopper comprises a first chopper, wherein the offset-reduction path further comprises:
   a second chopper configured to provide chopping of the input voltage to provide a chopped input voltage; and
   a second transconductance amplifier configured to receive the chopped input voltage and to provide an amplified chopped input voltage to the first chopper, wherein a feedback path output of the noise-filtering feedback path is coupled to an output of the second transconductance amplifier to provide the chopper feedback to the amplified chopped input voltage.

7. The circuit of claim 6, wherein the resistor has a resistance value that is chosen to be less than a resistance associated with an output of the second transconductance amplifier and to be greater than an inverse of a product of a chopping frequency associated with each of the first and second choppers and a capacitance associated with an input of the first transconductance amplifier.

8. The circuit of claim 1, wherein the input voltage is a differential input voltage, such that the resistor comprises a first resistor associated with a first input voltage of the differential input voltage and a second resistor associated with a second input voltage of the differential input voltage.

9. The circuit of claim 1, wherein the circuit is an integrated circuit.

10. A method for amplifying an input voltage to generate an output voltage in an operational amplifier (OP-AMP) system, the method comprising:
    receiving the input voltage at an input of a signal amplification path comprising a signal amplifier configured to amplify the input voltage to provide the output voltage at an output stage;
    providing a clock signal to a first chopper in an offset-reduction path configured to chop the input voltage, the offset-reduction path comprising a transconductance amplifier configured to mitigate an offset voltage in the input voltage at an output of the signal amplifier based on the chopped input voltage; and
    providing the clock signal to a second chopper in a noise-filtering feedback path having a feedback path input coupled to the input of the transconductance amplifier via a resistor, the resistor having a resistance value that is selected to increase an impedance at an input of the transconductance amplifier and to increase a gain in the noise-filtering feedback path to decrease chopping-induced noise in the offset-reduction path.

11. The method of claim 10, further comprising providing the clock signal to a notch filter associated with the noise-filtering feedback path.

12. The method of claim 10, wherein the transconductance amplifier is a first transconductance amplifier, the method further comprising providing the clock signal to a third chopper configured to provide chopping of the input voltage to provide a chopped input voltage to an input of a second transconductance amplifier configured to receive the chopped input voltage and to provide an amplified chopped input voltage to the first chopper, wherein a feedback path output of the noise-filtering feedback path is coupled to an output of the second transconductance amplifier to provide chopper feedback to the amplified chopped input voltage.

13. The method of claim 10, wherein the transconductance amplifier is a first transconductance amplifier, wherein the noise-filtering feedback path further comprises:
    a second transconductance amplifier having an input corresponding to the feedback path input and an output that is provided to the second chopper; and
    a third transconductance amplifier that is interconnected between the second chopper and a feedback path output.

14. The method of claim 13, wherein the resistor has a resistance value that is chosen to be less than a resistance associated with an output of the second transconductance amplifier and to be greater than an inverse of a product of a chopping frequency associated with each of the first and second choppers and a capacitance associated with an input of the first transconductance amplifier.

15. The method of claim 10, wherein receiving the input voltage comprises receiving the input voltage as a differential input voltage, such that the resistor comprises a first resistor associated with a first input voltage of the differential input voltage and a second resistor associated with a second input voltage of the differential input voltage.

16. An operational-amplifier (OP-AMP) system comprising:
    a signal amplification path comprising a signal amplifier and an output stage, the signal amplification path being configured to amplify an input voltage received at an input to provide an output voltage via the output stage; and
    an offset-reduction path coupled to the input of the signal amplification path and to an output of the signal amplifier, the offset-reduction path comprising:
        a first transconductance amplifier configured to receive the input voltage;
        a second transconductance amplifier having an output coupled to an output of the signal amplifier;
        a chopper interconnecting the first and second transconductance amplifiers; and
        a noise-filtering feedback path configured to provide chopper feedback with respect to an offset voltage associated with the first transconductance amplifier, the noise-filtering feedback path comprising a feedback path input coupled to the input of the second transconductance amplifier via a resistor having a resistance value that is chosen to be less than a resistance associated with an output of the first transconductance amplifier.

17. The system of claim 16, wherein the resistor has a resistance value that is selected to increase an impedance at an input of the transconductance amplifier and to increase a gain in the noise-filtering feedback path to decrease chopping-induced noise in the offset-reduction path.

18. The system of claim 16, wherein the noise-filtering feedback path further comprises a notch filter operating at clock a frequency that is approximately equal to a chopping frequency associated with the chopper.

19. The system of claim 16, wherein the chopper is a first chopper, and wherein the noise-filtering feedback path further comprises:
    a second chopper;
    a third transconductance amplifier having an input corresponding to the feedback path input and an output that is provided to the second chopper; and
    a fourth transconductance amplifier that is interconnected between the second chopper and a feedback path output.

20. The system of claim 16, wherein the input voltage is a differential input voltage, such that the resistor comprises a first resistor associated with a first input voltage of the differential input voltage and a second resistor associated with a second input voltage of the differential input voltage.

* * * * *